(12) United States Patent
Ando

(10) Patent No.: US 11,495,842 B2
(45) Date of Patent: Nov. 8, 2022

(54) HEAT DISSIPATING STRUCTURE AND BATTERY PROVIDED WITH THE SAME

(71) Applicant: SHIN-ETSU POLYMER CO., LTD., Tokyo (JP)

(72) Inventor: Hitoshi Ando, Saitama (JP)

(73) Assignee: SHIN-ETSU POLYMER CO., LTD., Tokyo (JP)

( * ) Notice: Subject to any disclaimer, the term of this patent is extended or adjusted under 35 U.S.C. 154(b) by 246 days.

(21) Appl. No.: 16/769,573

(22) PCT Filed: Dec. 5, 2018

(86) PCT No.: PCT/JP2018/044662
§ 371 (c)(1),
(2) Date: Jun. 3, 2020

(87) PCT Pub. No.: WO2019/131018
PCT Pub. Date: Jul. 4, 2019

(65) Prior Publication Data
US 2021/0376401 A1 Dec. 2, 2021

(30) Foreign Application Priority Data

Dec. 26, 2017 (JP) .............................. JP2017-248657
Jan. 23, 2018 (NL) ...................................... 2020306

(51) Int. Cl.
*H01M 10/613* (2014.01)
*H01M 10/617* (2014.01)
(Continued)

(52) U.S. Cl.
CPC ....... *H01M 10/613* (2015.04); *H01M 10/617* (2015.04); *H01M 10/625* (2015.04); *H01M 10/647* (2015.04); *H01M 10/653* (2015.04); *H01M 10/6556* (2015.04); *H01M 10/6567* (2015.04); *H01M 50/209* (2021.01); *H01M 2220/20* (2013.01)

(58) Field of Classification Search
CPC ............ H01M 10/613; H01M 10/617; H01M 10/625; H01M 10/647; H01M 10/653;
(Continued)

(56) References Cited

U.S. PATENT DOCUMENTS 3,544,375 A * 12/1970 Ruben ................... H01M 12/08
429/513
4,808,494 A * 2/1989 Palmer .................... H01M 6/36
429/112
(Continued)

FOREIGN PATENT DOCUMENTS

CN 102315501 A * 1/2012 .......... H01M 10/613
CN 102856516 * 1/2013 ........ H01M 10/0418
(Continued)

OTHER PUBLICATIONS

International Search Report in PCT/JP2018/044662, dated Jan. 31, 2019. 2pp.

*Primary Examiner* — Kaity V Chandler
(74) *Attorney, Agent, or Firm* — Hauptman Ham, LLP

(57) ABSTRACT

A heat dissipating structure for a battery is provided between a heat source and a cooling member and enables heat dissipation from the heat source by conducting heat from the heat source to the cooling member. The heat dissipating structure includes: a thermally conductive sheet containing at least one of metal, carbon, and ceramic and settable between the heat source and the cooling member; and a cushion member at least partially covered with the thermally conductive sheet.

8 Claims, 7 Drawing Sheets

(51) Int. Cl.
  *H01M 10/625*   (2014.01)
  *H01M 10/647*   (2014.01)
  *H01M 10/6556*   (2014.01)
  *H01M 10/6567*   (2014.01)
  *H01M 50/209*   (2021.01)
  *H01M 10/653*   (2014.01)

(58) Field of Classification Search
  CPC ........... H01M 10/6556; H01M 50/209; H01M 2220/20; H01M 10/655; H01M 50/20; Y02E 60/10; H01L 23/36; H01L 23/367; H01L 23/3677; H01L 23/373; H01L 23/473; H01L 23/3737; H01L 23/3736; H01L 33/642; H01L 2224/45015; H01L 33/64; H01L 23/49838; H01L 23/467; H05K 1/0203
  See application file for complete search history.

(56) References Cited

U.S. PATENT DOCUMENTS

| | | | | |
|---|---|---|---|---|
| 9,638,475 | B2* | 5/2017 | Burgers | H01M 10/625 |
| 10,211,494 | B1* | 2/2019 | Tsenter | H01M 16/003 |
| 2002/0182482 | A1* | 12/2002 | Hockaday | H01M 50/30 |
| | | | | 429/57 |
| 2006/0003203 | A1* | 1/2006 | Wang | H01M 8/083 |
| | | | | 429/529 |
| 2009/0181266 | A1* | 7/2009 | Park | C01B 3/0021 |
| | | | | 205/147 |
| 2013/0295422 | A1* | 11/2013 | Kim | H01M 10/6552 |
| | | | | 429/72 |
| 2018/0108956 | A1* | 4/2018 | Fortenbacher | H01M 10/6571 |
| 2018/0191042 | A1* | 7/2018 | Chu | H01M 10/6556 |
| 2019/0051907 | A1* | 2/2019 | Cui | H01M 4/8621 |
| 2019/0056147 | A1* | 2/2019 | Brisebois | F24S 50/00 |

FOREIGN PATENT DOCUMENTS

| | | | | |
|---|---|---|---|---|
| CN | 106374162 A | * | 2/2017 | ......... H01M 10/613 |
| CN | 104937762 B | * | 9/2017 | ......... H01M 10/625 |
| DE | 102014019002 A1 | | 6/2016 | |
| EP | 2081421 A2 | | 7/2009 | |
| EP | 3309865 A1 | | 4/2018 | |
| FR | 2986190 A1 | * | 8/2013 | ............... B60K 1/04 |
| JP | H11354166 A | | 12/1999 | |
| JP | 2007184392 A | | 7/2007 | |
| JP | 2008243999 A | | 10/2008 | |
| JP | 2012190674 A | | 10/2012 | |
| JP | 201810974 A | | 1/2018 | |

* cited by examiner

HEAT DISSIPATING STRUCTURE AND BATTERY PROVIDED WITH THE SAME

CROSS REFERENCE

The present application is a National Phase of International Application No. PCT/JP2018/044662 filed Dec. 5, 2018 and claims the benefit of priorities of Japanese Patent Application No. 2017-248657, filed on Dec. 26, 2017 in Japan and Netherlands Patent Application NO. N2020306, filed on Jan. 23, 2018 in the Netherlands, the entire contents of which are incorporated herein by reference. The entire contents of patents, patent applications, and literatures cited in the present application are also incorporated herein by reference.

TECHNICAL FIELD

The present invention relates to a heat dissipating structure and a battery provided with the same.

BACKGROUND ART

Control systems for vehicles, aircraft, ships, or household or business electronic devices have become more precise and complicated, and accordingly integration densities of compact electronic components on a circuit board have been increasing steadily. Consequently, it is desired to solve problems such as breakdown and shortening of service life of the electronic component due to heat generated in the circuit-board peripheral area To rapidly dissipate heat from the circuit board, the circuit board itself has been made of a material having excellent heat dissipation property, a heat sink has been provided, and/or a heat dissipation fan has been operated. Among these measures, making the circuit board of a material excellent in heat dissipation property, such as diamond, aluminum nitride (AlN), or cubic-boron nitride (cBN), extremely increases the cost of the circuit board. Also, installation of the heat dissipation fan leads to problems such as failure of a rotary component, i.e., a fan, the need for maintenance to prevent failures, and difficulty in securing its installation space. On the other hand, heat dissipation fins are widely used as heat dissipation components owing to its simple structure including many columnar or tabular protrusions of a metal having high thermal conduction property (for example, aluminum) to extend its surface areas, thereby to further enhance the heat dissipation (see Patent Literature 1).

Incidentally, a movement to gradually convert conventional gasoline or diesel vehicles into electric vehicles is now growing around the world to reduce the human impact on the environment. Particularly, in addition to European countries including France, the Netherlands, and Germany, China has declared to switch from gasoline and diesel vehicles to electric vehicles completely by 2040. The development of high-performance battery and installation of many charging stands are needed for spread of electric vehicles. Particularly, the major problem is the development of technology for enhancing the charge and discharge function of lithium-based vehicle battery. It is well known that the vehicle battery cannot sufficiently exhibit the function of charging and discharging at a temperature equals to or higher than 60 degrees Celsius. It is therefore considered important to enhance the heat dissipation of the battery, as well as the circuit board described above.

To rapidly dissipate the heat of the battery, the battery employs a structure including: a water cooling pipe arranged in a housing made of a metal having excellent thermal conduction property, such as aluminum; a plurality of battery cells arranged in the housing; and an adhesive rubber sheet sandwiched between the battery cells and the bottom surface of the housing. Hereinafter, the description will be made with reference to a drawing.

FIG. 7 shows a schematic sectional view of a conventional battery. A battery 100 of FIG. 7 includes a plurality of battery cells 101 on an inner bottom surface 103 of a housing 102 made of aluminum or aluminum-based alloy. Water cooling pipes 105 for cooling-water flow are provided at a bottom 104 of the housing 102. A rubber sheet (for example, a sheet made of silicone rubber curable at room temperature) 106 is interposed between the battery cells 101 and the bottom 104 to fix the battery cells 101 in the housing 102. In the battery 100 having such a structure, heat of the battery cells 101 is transferred through the rubber sheet 106 to the housing 102 and is efficiently removed by water cooling.

CITATION LIST

Patent Literature

[PATENT LITERATURE 1] Japanese Patent Laid-Open No. 2008-243999

SUMMARY OF INVENTION

Technical Problem

However, the heat dissipating structure of the conventional battery 100 as shown in FIG. 7 has following problems to be solved. The low thermal conduction property of the rubber sheet 106 compared to aluminum or graphite hinders the efficient heat transfer from the battery cells 101 to the housing 102. Instead of the rubber sheet 106, a spacer made of, for example, graphite may be used. However, a gap is generated between the battery cells 101 and the spacer due to unevenness of lower surfaces of the battery cells 101, thereby decreasing heat transfer efficiency. Since lower surfaces of battery cells can take various shapes, high-efficiency heat transfer irrespective of the shapes of battery cells is demanded. Also, battery-cell containers made of lighter weight materials, and a heat dissipating structure corresponding to the lightweight battery cell are demanded. This applies not only to batteries but also to other heat sources such as circuit boards and electronic device bodies.

The present invention has been made in view of the above problems, and its object is to provide a heat dissipating structure having excellent heat dissipation efficiency irrespective of shapes and materials of its heat source, and a battery including the same.

Solution to Problem (1) A heat dissipating structure according to an embodiment to achieve the above object is provided between a heat source and a cooling member and enables heat dissipation from the heat source by conducting the heat from the heat source to the cooling member. The heat dissipating structure includes: a thermally conductive sheet containing at least one of metal, carbon, and ceramic and settable between the heat source and the cooling member; and a cushion member at least partially covered with the thermally conductive sheet.

(2) In a heat dissipating structure according to another embodiment, the thermally conductive sheet preferably has an O-shaped cross-section or a downward-C-shaped cross-section with an opening facing a cooling member in a part disposed between the heat source and the cooling member, and a cushion member is arranged inside the thermally conductive sheet.

(3) In a heat dissipating structure according to another embodiment, in any of the cushion members, at least one end of both ends in a longitudinal direction of the heat dissipating structure is preferably exposed from a thermally conductive sheet.

(4) A heat dissipating structure according to another embodiment preferably further includes a rubber sheet tightly fixing any of the thermally conductive sheets to at least one of the heat source and a periphery of the cooling member.

(5) In a heat dissipating structure according to another embodiment, the rubber sheet is preferably made of silicone rubber.

(6) In a heat dissipating structure according to another embodiment, any of the thermally conductive sheets preferably contains carbon filler and resin.

(7) A heat dissipating structure according to another embodiment preferably further includes energization electrodes capable of supplying electricity to heat any of the thermally conductive sheets or any of the cushion members.

(8) A battery according to an embodiment includes: a plurality of battery cells, as a heat source, in a housing to come into contact with a cooling member; and any of the heat dissipating structures. The heat dissipating structure includes a thermally conductive sheet containing at least one of metal, carbon, and ceramic and settable between the plurality of battery cells and the cooling member, and a cushion member at least partially covered with the thermally conductive sheet.

(9) In a battery according to another embodiment, a plurality of the heat dissipating structures is provided in a housing, each heat dissipating structure mounting one or more of battery cells provided in the housing.

(10) In a battery according to another embodiment, the plurality of heat dissipating structures is arranged at a distance from one another not to come into contact with each other even when compressed by the battery cells mounted on the heat dissipating structures.

Advantageous Effect of Invention

According to the present invention, it is possible to provide a heat dissipating structure having excellent heat dissipation efficiency irrespective of shapes and materials of its heat source and a battery including the same.

Figure 1:
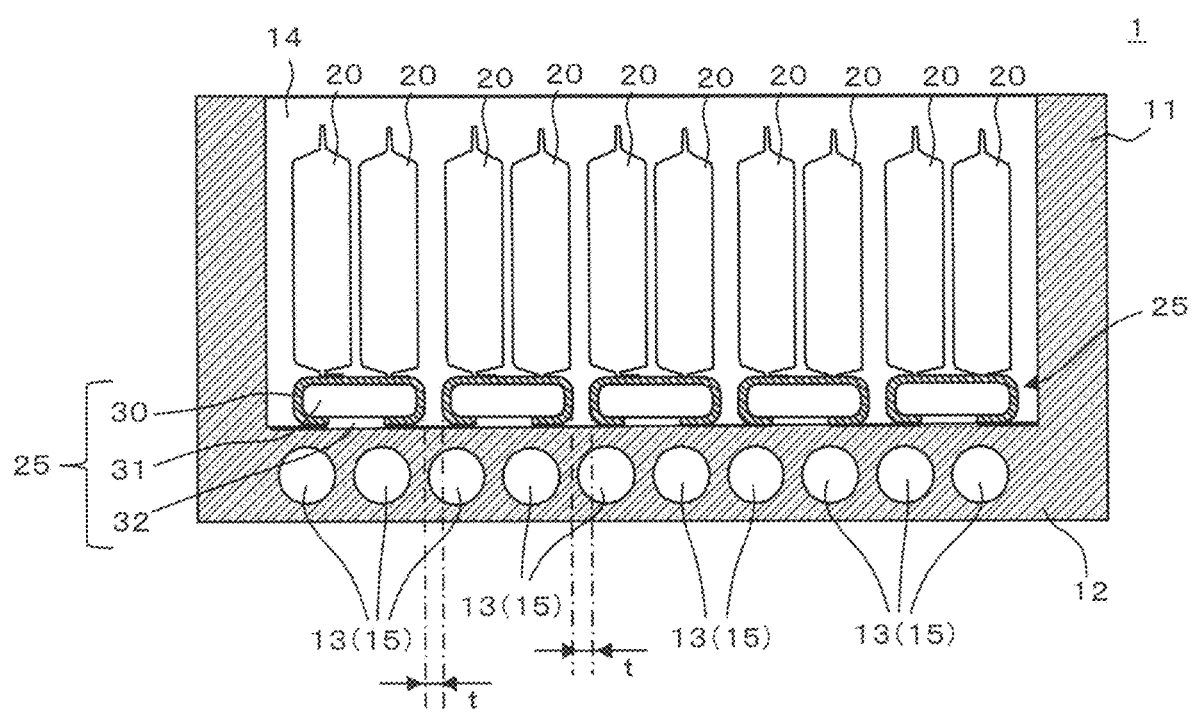
FIG. 1 shows vertical cross-sectional views of a heat dissipating structure according to a first embodiment and a battery including a plurality of the heat dissipating structures.

DESCRIPTION OF THE REFERENCE NUMERALS 1, 1a, 1b battery, 11 housing, 12 bottom (an example of cooling member or an example of a part of housing near cooling member), 15 cooling member, 20, 20a battery cell (an example of heat source), 25, 45 heat dissipating structure, 30 thermally conductive sheet, 31 cushion member, 32 opening, 50 rubber sheet, 51, 52 electrodes for energization

DESCRIPTION OF EMBODIMENTS

Next, embodiments of the present invention will be described with reference to the drawings. Note that, each of the embodiments described below does not limit the claimed invention and not all the elements and combinations thereof described in the respective embodiments are necessarily essential to the solution of the present invention.

First Embodiment

FIG. 1 shows vertical cross-sectional views of a heat dissipating structure according to a first embodiment and a battery including a plurality of the heat dissipating structures.

A heat dissipating structure 25 of the first embodiment is provided between a battery cell 20, an example of a heat source, and a cooling member (e.g., cooling water) and enables heat dissipation from the battery cell 20 by conducting heat from the battery cell 20 to the cooling member 15. The cooling member may be referred to as a cooling agent. The heat dissipating structure 25 includes: a thermally conductive sheet 30 containing at least one of metal, carbon, and ceramic and settable between the battery cell 20 and the cooling member 15; and a cushion member 31 at least partially covered with the thermally conductive sheet 30.

The thermally conductive sheet 30 preferably has an O-shaped vertical section or a downward-C-shaped vertical section with an opening 32 facing the cooling member 15 in a part arranged between the battery cell 20 and the cooling member 15. The cushion member 31 is arranged inside the thermally conductive sheet 30. Also, in the cushion member 31, at least one end of both ends in a longitudinal direction of the heat dissipating structure 25 (direction of the face side and the back side of the drawing sheet of FIG. 1) is preferably exposed from the thermally conductive sheet 30. A battery 1 of FIG. 1 includes a plurality of the battery cells 20, as a heat source, in the housing 11 to come into contact with the cooling members 15. Herein, terms "cross section" and "vertical cross section" each mean a cross section in a direction of cutting perpendicularly from the upper opening face in an interior 14 to a bottom 12 of the housing 11 of the battery 1.

(1) Overview of Battery Configuration

In this embodiment, the battery 1 is a battery for electric vehicles, for example, and includes the plurality of battery cells 20. The battery 1 includes the bottomed housing 11 opening at one side. The housing 11 is preferably made of aluminum or aluminum-based alloy. The battery cells 20 are arranged in the interior 14 of the housing 11. A plurality of electrodes is protruded on each of the battery cells 20 (see FIG. 2). The battery cells 20 preferably come in close contact with each other due to force imparted to both sides thereof in a direction to be compressed using, for example, a screw (not shown). One or more water cooling pipes 13 are provided at the bottom 12 of the housing 11 to let the cooling water, an example of the cooling member 15, to flow therethrough. The battery cells 20 are arranged in the housing 11 to sandwich the heat dissipating structures 25 between the bottom 12 and the battery cells 20.

Preferably, a plurality of the heat dissipating structures 25 is provided in the housing 11 and each heat dissipating structure 25 mounts one or more of the battery cells 20 arranged in the housing 11. Although, in the FIG. 1, heat dissipating structures 25 each mount two of the battery cells 20, the number of the mounted battery cells 20 may be one or three or more.

The heat dissipating structures 25 in the housing 11 are arranged at a distance "t" from one another not to come into contact with each other even when compressed by the battery cells 20 mounted thereon. This is necessary to avoid collision between adjacent heat dissipating structures 25. The distance between the adjacent heat dissipating structures 25 ("t" mentioned above, or "T" described later) is preferably 5 mm, more preferably 2 mm, depending on the amount of deformation and the amount of heat conduction of the heat dissipating structures 25.

In the battery 1 having such a structure, the heat of the battery cells 20 is transferred through the heat dissipating structures 25 to the housing 11 and is efficiently removed by water cooling. The cooling member 15 is not limited to the cooling water, but is interpreted to include organic solvents, such as liquid nitrogen and ethanol. The cooling member 15 is not necessarily a liquid when used for cooling but may be a gas or a solid.

(2) Thermally Conductive Sheet

In this embodiment, the thermally conductive sheet 30 between the battery cells 20 and the bottom 12 has an O shape or downward-C shape in a vertical cross-sectional view. The downward-C shape may be referred to as a downward-U shape. FIG. 1 illustrates the thermally conductive sheet 30 having the downward-C shape. The thermally conductive sheet 30 may have an inverted-U shape, or an inverted-V shape in the vertical cross-sectional view. However, since thermal conductivity is enhanced when an outer surface of the thermally conductive sheet 30, but not its end faces, is in contact with the bottom 12, it is preferable that the thermally conductive sheet 30 have the inverted O shape, or the downward-C shape in the vertical cross-sectional view.

The thermally conductive sheet 30 preferably contains carbon, and more preferably contains carbon filler and resin. The term "carbon" herein is broadly interpreted to include substances having any structure made of carbon (element symbol: C) such as graphite, carbon black having lower crystallinity than graphite, expanded graphite, diamond, diamond like carbon having a structure similar to diamond.

In this embodiment, the thermally conductive sheet 30 may be a thin sheet formed by curing a material in which graphite fibers and carbon particles are mixed and dispersed in resin. Instead of the graphite fibers or the carbon particles, an expanded graphite filler may be used. Expanded graphite is a graphite in which a graphite intercalation compound formed by inserting a substance into flake graphite by a chemical reaction is rapidly heated to gasify the substance between the layers, and the release of the gas generated at that time causes expansion of the interlayer spacing of the graphite, thus expanding in the stacking direction. The graphite fibers, the carbon particles, or the expanded graphite filler are all included in the concept of the carbon filler.

The thermally conductive sheet 30 may contain at least one of metal and ceramic instead of or in addition to carbon. The metal can be selected from materials having relatively high thermal conductivity such as aluminum, copper, and an alloy containing at least one of them. The ceramic can be selected from materials having relatively high thermal conductivity, such as AlN, cBN, and hBN.

The resin may account for more than 50%, or the carbon filler may account for more than 50%, of the total mass of the thermally conductive sheet 30. As long as there is no serious problem in the thermal conduction, the thermally conductive sheet 30 may be mainly made of the resin or mainly made of the carbon filler. For the resin, thermoplastic resin can be suitably used, for example. For the thermoplastic resin, resin having a high melting point that does not melt when conducting heat from the battery cells 20, an example of the heat source, is preferred, and polyphenylene sulfide (PPS), polyether ether ketone (PEEK), polyamide imide (PAI), for example, may be preferably exemplified. The resin is dispersed in the form of, for example, particles in the empty space in the carbon filler before molding of the thermally conductive sheet 30. In the thermally conductive sheet 30, in addition to the carbon filler and the resin, AlN or diamond may be dispersed as a filler for further improving the thermal conduction. An elastomer more flexible than the resin may be used instead of the resin.

The thermally conductive sheet 30 preferably has excellent thermal conduction property compared to the cushion member 31 described later but is not necessarily required to have excellent electrical conductivity. The thermal conductivity of the thermally conductive sheet 30 preferably equals to or higher than 10 W/m K. In this embodiment, the thermally conductive sheet 30 preferably contains the graphite and the carbon having lower crystallinity than the graphite to configure a network facilitating electrical flow in the thermally conductive sheet 30.

However, the thermally conductive sheet 30 is not necessarily required to have excellent electrical conductivity and may have only thermal conduction property. In that case, the thermally conductive sheet 30 may be a sheet containing AlN, diamond, diamond-like carbon (lower electrical conductivity than graphite). As long as the thermally conductive sheet 30 has a curved nature (or bendability), its thickness is not restricted but is preferably 0.3 to 5 mm, and more preferably 0.3 to 1 mm. Note that, since the thermal conductivity of the thermally conductive sheet 30 decreases as its thickness increases, the thickness is preferably determined by comprehensively taking the strength, flexibility and thermal conduction property of the sheet into consideration.

In the heat dissipating structure 25, the thermally conductive sheet 30 as a skin includes the cushion member 31 in its internal space. Part of the thermally conductive sheet 30 may be provided with an opening 32 to expose the cushion member 31.

(3) Cushion Member

The cushion member 31 is an elastic body covered with the thermally conductive sheet 30. The cushion member 31 is provided between the battery cells 20 and the bottom 12 to have a function of exhibiting cushioning property and a function as a protective member preventing the conductive sheet 30 from, for example, being damaged due to the load applied to the thermally conductive sheet 30. The cushion member 31 has low thermal conduction property compared to the thermally conductive sheet 30.

The cushion member 31 may be either a sponge-like member containing air bubbles, or a rubber-like elastic body containing no air bubbles but is preferably the sponge-like member. The cushion member 31 preferably contains: a thermosetting elastomer such as silicone rubber, urethane rubber, isoprene rubber, ethylene propylene rubber, natural rubber, ethylene propylene diene rubber, nitrile rubber (NBR), or styrene butadiene rubber (SBR); a thermoplastic elastomer on urethane basis, ester basis, styrene basis, olefin basis, butadiene basis, or fluorine basis; or a composite thereof. The cushion member 31 is preferably made of high heat-resistant materials capable of maintaining its shape without melting or decomposing by the heat conducted through the thermally conductive sheet 30. In his embodiment, the cushion member 31 is preferably made of a material in which a urethane-basis elastomer is impregnated with silicone, or silicone rubber. The cushion member 31 may be formed by dispersing a filler typified by, for example, AlN, cBN, hBN, and particles of diamond, into the rubber to improve its thermal conduction property to the extent possible.

Figure 2:
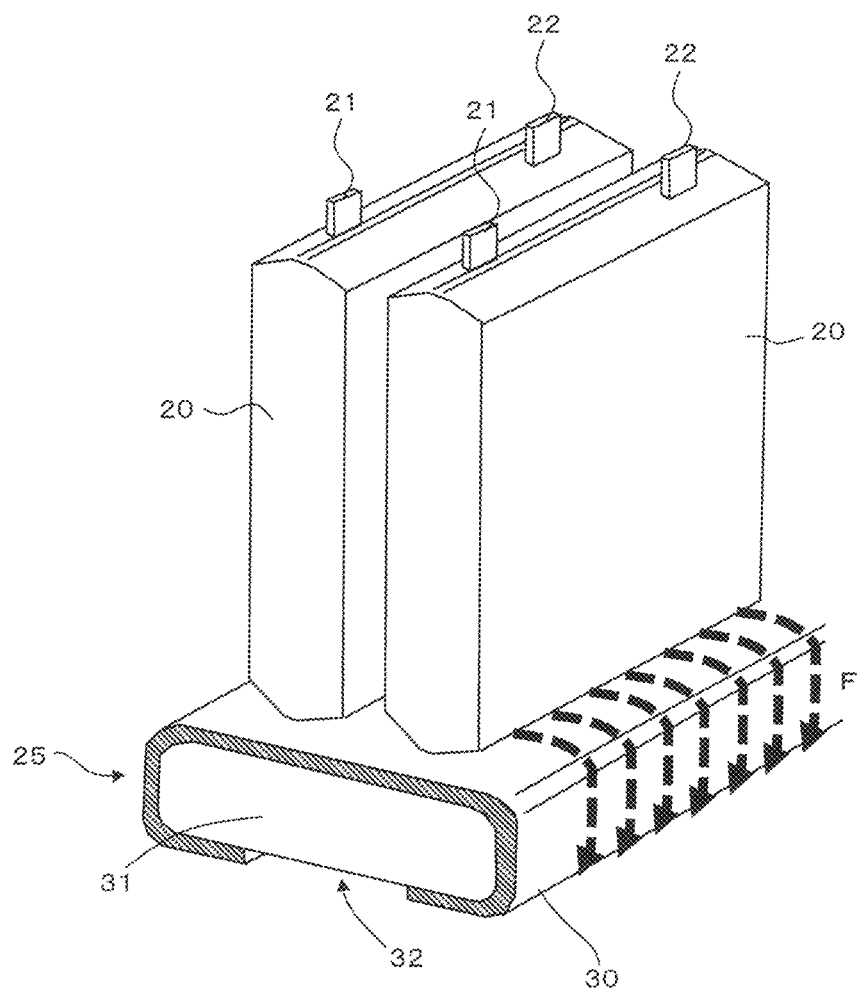
FIG. 2 shows a perspective view of the heat dissipating structures of FIG. 1 with two battery cells mounted thereon.

FIG. 2 shows a perspective view of the heat dissipating structure of FIG. 1 with two batteries mounted thereon.

The battery cells 20 each include electrodes 21, 22 on a side opposite to a side in contact with the heat dissipating structure 25 (upper side in FIGS. 1, 2). The heat produced by the battery cells 20 in charging or discharging is transferred from lower ends of the battery cells 20 through the thermally conductive sheet 30 of the heat dissipating structure 25 (see arrows F in FIG. 2) to the bottom 12 of the housing 11, and then to the cooling member 15. In this way, effective heat removal of the battery cells 20 is achieved.

FIG. 3A to FIG. 3D show six views of the modifications of the heat dissipating structure of FIG. 1.

Figure 3A:
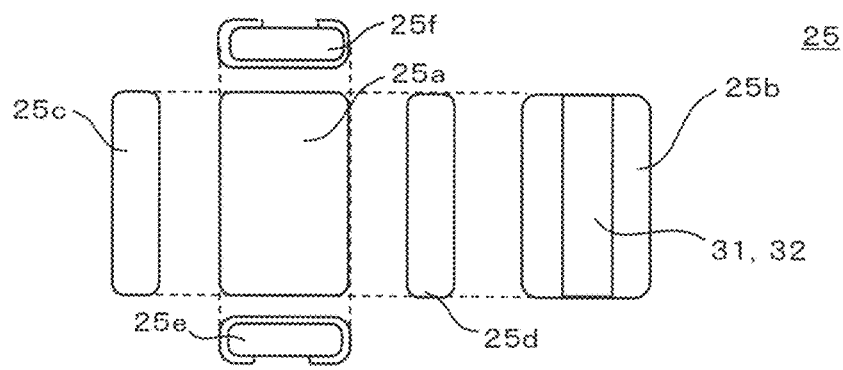
FIG. 3A to FIG. 3D show six views of the modifications of the heat dissipating structure of FIG. 1.

The heat dissipating structure 25 of FIG. 3A has the structure shown in FIGS. 1 and 2, in which the thermally conductive sheet 30 covers the substantially rectangular-parallelepiped cushion member 31 except for both end surfaces in the longitudinal direction and a part of a bottom surface of the cushion member 31. Specifically, a top surface 25a and left and right side surfaces 25c, 25d of the heat dissipating structure 25 are covered with the thermally conductive sheet 30. A front surface 25e and a back surface 25f of the heat dissipating structure 25 expose the surfaces of the cushion member 31. A bottom face 25b of the heat dissipating structure 25 is covered with the thermally conductive sheet 30 to form the opening 32 in a central region in the width direction of the heat dissipating structure 25. The cushion member 31 is exposed from the opening 32. Although in this embodiment, the cushion member 31 does not protrude to the outside of the thermally conductive sheet 30, the bottom surface of the cushion member 31 may protrude towards the outside up to a position flush with the thermally conductive sheet 30 or further outward than the thermally conductive sheet 30.

Figure 3B:
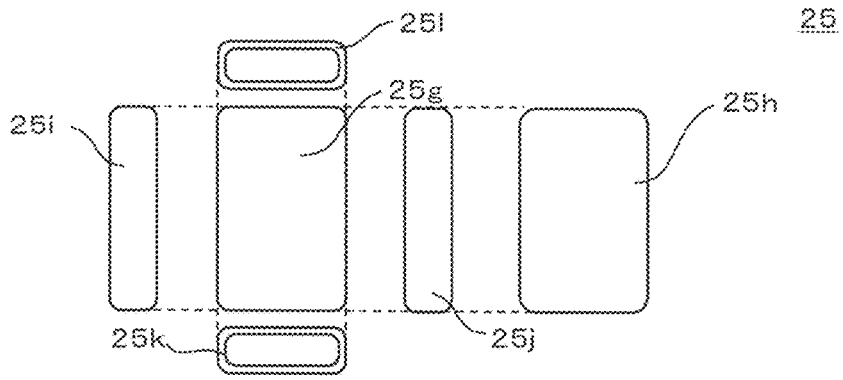

A heat dissipating structure 25 of FIG. 3B is a first modification of the heat dissipating structure 25 of FIG. 3A and has a structure in which the thermally conductive sheet 30 covers the substantially rectangular parallelepiped cushion member 31 except for both end surfaces in the longitudinal direction of the cushion member 31. Specifically, a top surface 25g, a bottom surface 25h, and left and right both side surfaces 25i, 25j are covered with the thermally conductive sheet 30. A front surface 25k and a back surface 25l of the heat dissipating structure 25 expose the surfaces of the cushion member 31.

Figure 3C:
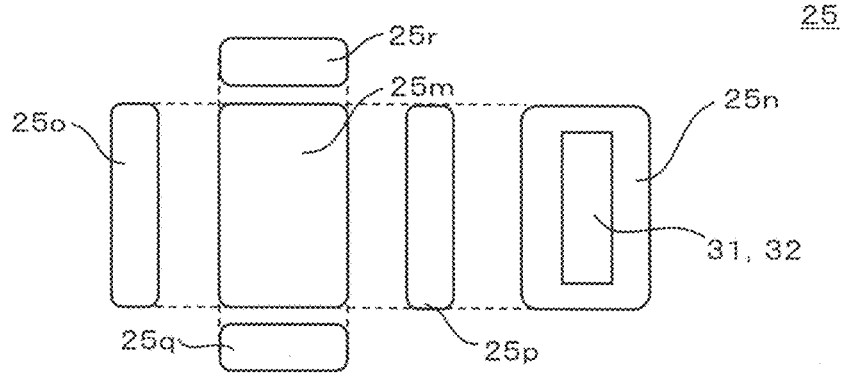

A heat dissipating structure 25 of FIG. 3C is a second modification of the heat dissipating structure 25 of FIG. 3A and has a structure in which the thermally conductive sheet 30 covers the substantially rectangular parallelepiped cushion member 31 except for a part of the bottom surface of the cushion member 31. Specifically, a top surface 25m, left and right side surfaces 25o, 25p, front surface 25q, and a back surface 25r are covered with the thermally conductive sheet 30. A part of a bottom surface 25n of the heat dissipating structure 25 has the opening 32 to expose the surface of the cushion member 31. The bottom surface 25n of the heat dissipating structure 25 has the opening 32 in its substantially central part. Although in this embodiment, the cushion member 31 does not protrude to the outside of the thermally conductive sheet 30, the bottom surface of the cushion member 31 may protrude towards the outside up to a position flush with the thermally conductive sheet 30 or further outward than the thermally conductive sheet 30.

Figure 3D:
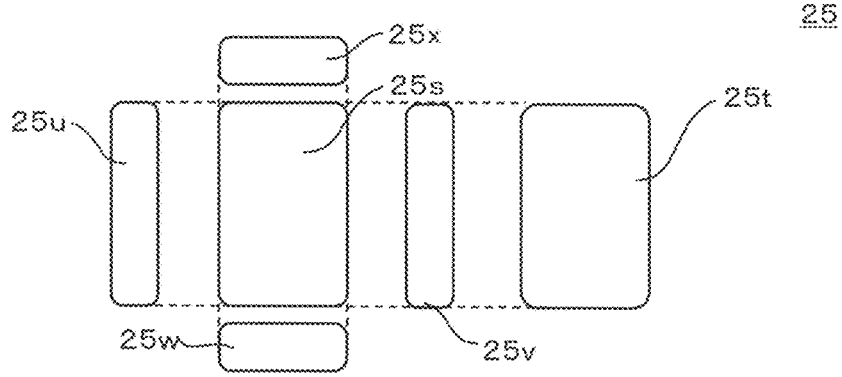

A heat dissipating structure 25 of FIG. 3D is a third modification of the heat dissipating structure 25 of FIG. 3A and has a structure in which the thermally conductive sheet 30 covers all surfaces of the substantially rectangular parallelepiped cushion member 31. Specifically, a top surface 25s, a back surface 25t, left and right side surfaces 25u, 25v, front surface 25w, and a back surface 25x are covered with the thermally conductive sheet 30.

The heat dissipating structure 25 is not limited to the above-described forms but can be modified. For example, a heat dissipating structure 25 having a structure in which the thermally conductive sheet 30 covers the substantially rectangular parallelepiped cushion member 31 except for one end surface of both end surfaces in the longitudinal direction of the cushion member 31 may be used. Owing to the exposure of a part of the cushion member 31 from the thermally conductive sheet 30, the cushion member 31 becomes more susceptible of modifications when the battery cells 20 are mounted on the heat dissipating structure 25.

(4) Preferred Method of Assembling Battery

Next, a method of assembling (=manufacturing method) the battery 1 according to this embodiment will be exemplified.

(a) A resin material typified by PPS, etc., and at least one of graphite filler and carbon filler having lower crystallinity than graphite (preferred in the form of particles, fibers, etc.) are stirred in a liquid (water, for example) to form a felt sheet in the same method as papermaking.

(b) Subsequently, the felt sheet is shaped to have a cross sectional shape identical or similar to that of the thermally conductive sheet 30 of FIG. 1.

(c) The cushion member 31 is put inside the thermally conductive sheet 30 to complete the heat dissipating structure 25. At this time, the cushion member 31 and the thermally conductive sheet 30 may be fixed using or without using fixing means such as a heat resistant adhesive, a double-sided tape, or a screw.

(d) Lastly, the heat dissipating structure 25 is assembled into the battery 1. The heat dissipating structure can be mounted on the bottom 12 with or without a heat resistant adhesive or double-sided tapes applied therebetween. The manufacturing method can be adopted in a second embodiment and in subsequent embodiments.

Second Embodiment

Subsequently, a second embodiment of the heat dissipating structure according to the present invention and the battery including the same will be described. In the second embodiment, the common features with the first embodiment are described in the description of the first embodiment and redundant description is omitted.

Figure 4:
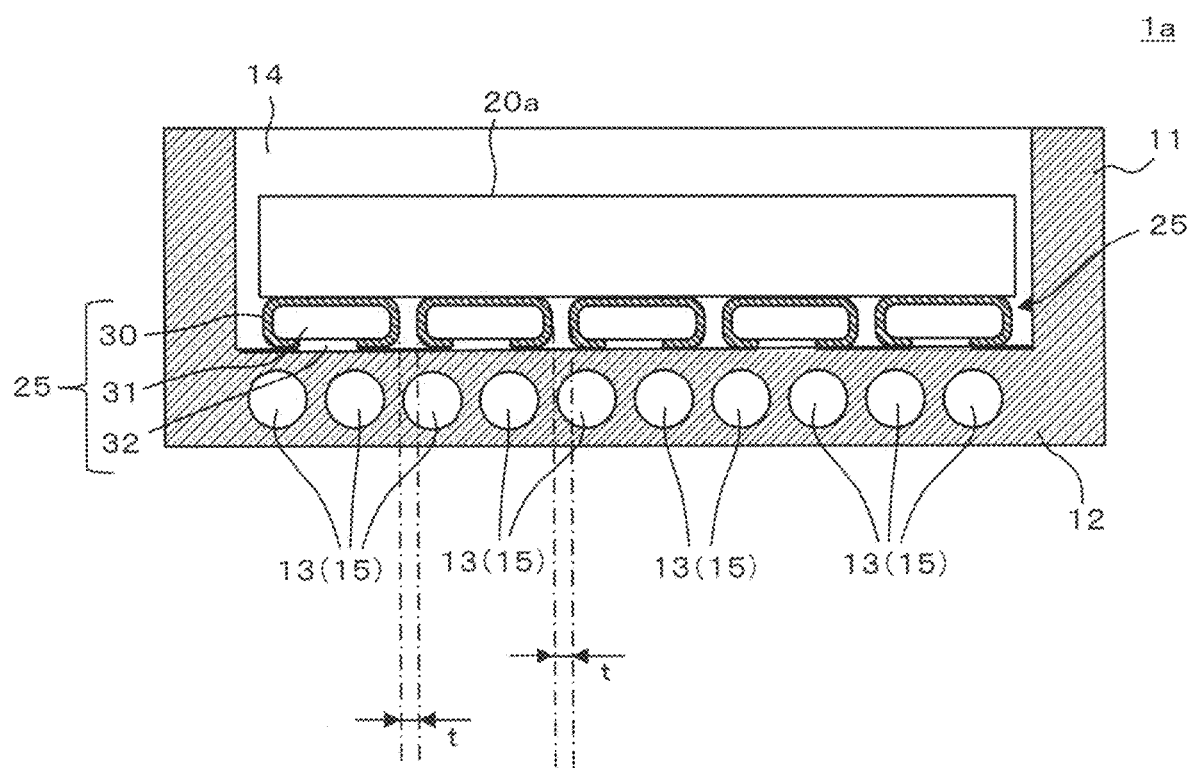
FIG. 4 shows vertical cross-sectional views of a heat dissipating structure according to a second embodiment and a battery including a plurality of the heat dissipating structures.

FIG. 4 shows vertical cross-sectional views of a heat dissipating structure according to a second embodiment and a battery including a plurality of the heat dissipating structures.

A battery 1a according to the second embodiment has a structure in which a plurality of heat dissipating structures 25 supports one battery cell 20a larger in size than the battery cell 20 of the first embodiment, which is different from the battery 1 of the first embodiment, and other features are in common with the battery 1. Hereinafter, the features different from the first embodiment will be described.

In the battery 1a according to the second embodiment, the battery cell 20a is mounted on five heat dissipating structures 25 having the same structure as in the first embodiment. The heat dissipating structures 25 are compressed by the weight of the battery cell 1a. This brings each thermally conductive sheet 30 into close contact with both the battery cell 20a and the bottom 12 of the housing 11, thereby improving the thermal conduction property. Note that, each of the heat dissipating structures 25 in the housing 11 is arranged at the distance "t" from one another not to come into contact with each other even when compressed by mounting thereon the battery cell 20a.

Third Embodiment

Subsequently, a third embodiment of the heat dissipating structure according to the present invention and the battery including the same will be described. In the third embodiment, features in common with each of the above-described embodiments are described in the description of the respective embodiments and redundant description is omitted.

Figure 5A:
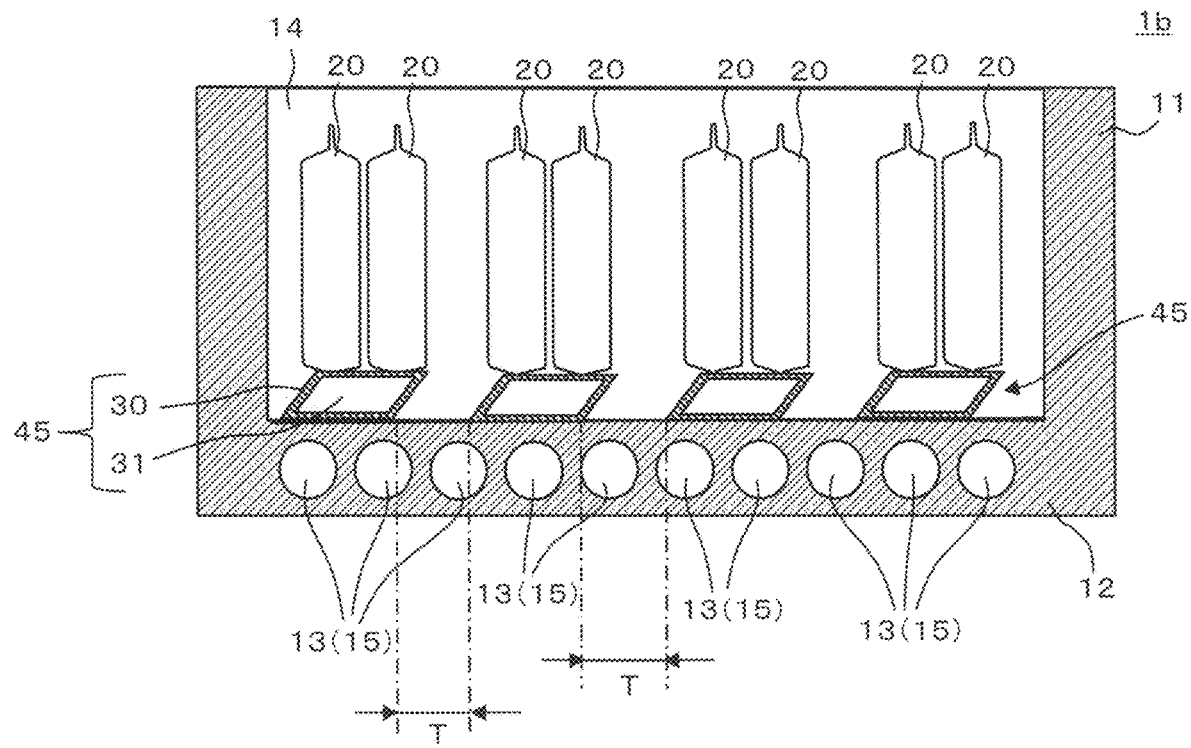
FIG. 5A shows vertical cross-sectional views of a heat dissipating structure according to a third embodiment and a battery including a plurality of the heat dissipating structures.
Figure 5B:
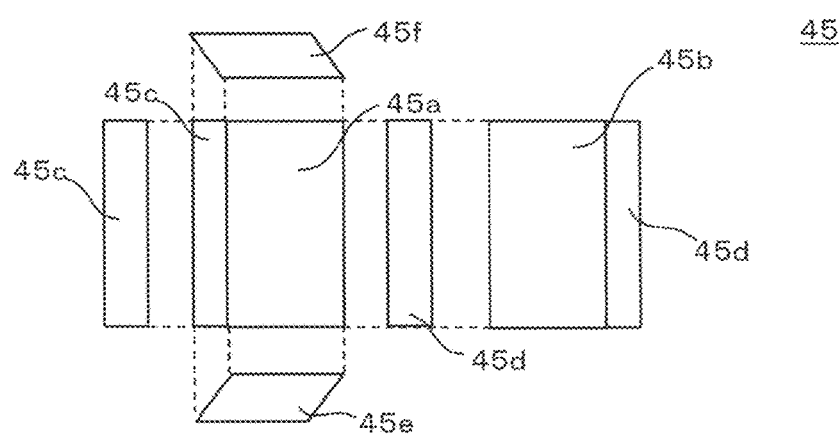
FIG. 5B shows six views of the heat dissipating structure.

FIG. 5A shows vertical cross-sectional views of a heat dissipating structure according to a third embodiment and a battery including a plurality of the heat dissipating structures, and FIG. 5B shows six views of the heat dissipating structure.

In a battery 1b according to the third embodiment, a heat dissipating structures 45 having a substantially parallelogram shape in the vertical sectional view supports the battery cells 20, which is different from the battery 1 according to the first embodiment, and other features are in common with the batteries 1. Hereinafter, the features different from the first embodiment will be mainly described.

As shown in FIG. 5A and FIG. 5B, in the heat dissipating structure 45, all surfaces of the columnar cushion member 31 having substantially parallelogram-shaped end surfaces are fully covered with the thermally conductive sheet 30. The FIG. 5A illustrates a vertical cross section of the heat dissipating structure 45. The number of heat dissipating structures 45 arranged in the housing 11 is four. Each of the heat dissipating structures 45 mounts two of the battery cells 20. The heat dissipating structures 45 lean toward the bottom 12 by the weight of the battery cells 20 and are compressed. Since each thermally conductive sheet 30 is in surface contact with the bottom 12 of the housing 11, heat is easily transferred from the battery cells 20 to the bottom 12. The heat dissipating structures 45 are arranged at a distance "T" from one another not to abut with each other even when compressed to lean toward the bottom 12. Though two of the battery cells 20 are arranged on each heat dissipating structure 45, the number of the mounted battery cells 20 may be one or three or more.

In the heat dissipating structure 45, all six surfaces, i.e., a top surface 45a a bottom surface 45b, left and right side surfaces 45c, 45d, front surface 45e, and a back surface 45f of the cushion member 31 are covered with the thermally conductive sheet 30. The cushion member 31 is not exposed to the outside of the heat dissipating structure 45. However, like the various heat dissipating structures 25 described in the first embodiment (see FIG. 3A to FIG. 3D), the heat dissipating structure 45 may have the cushion member 31 exposed to the outside.

(Heat Dissipating Structure with Heat Generation Function)

Figure 6A:
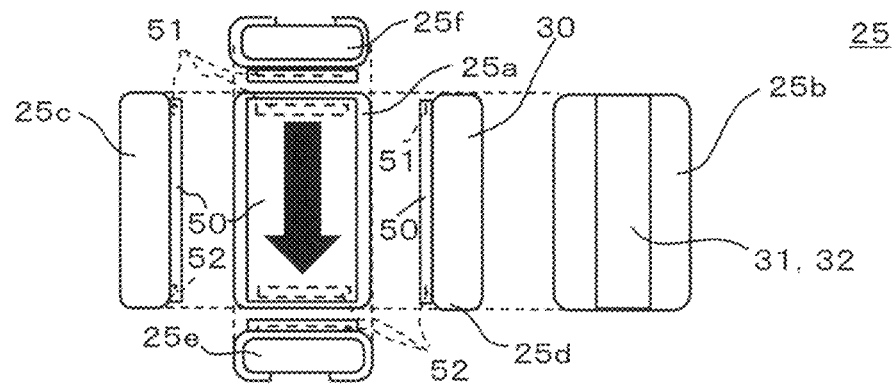
FIG. 6A to FIG. 6C show six views of various modifications of the heat dissipating structure according to the present invention.
Figure 6B:
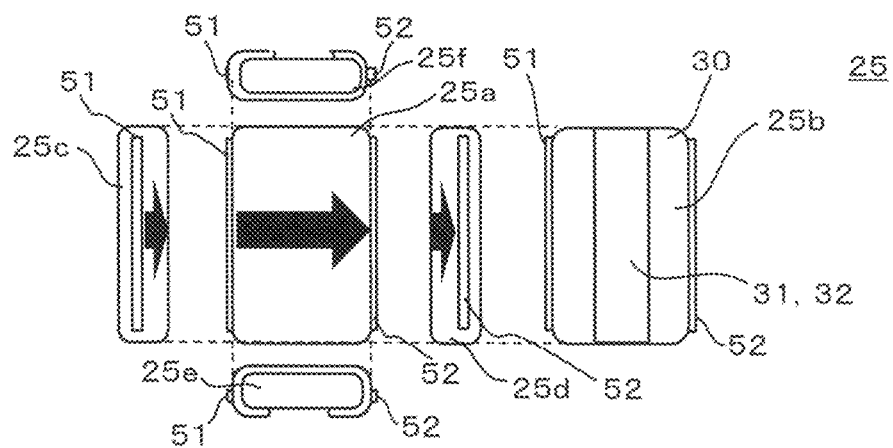
Figure 6C:
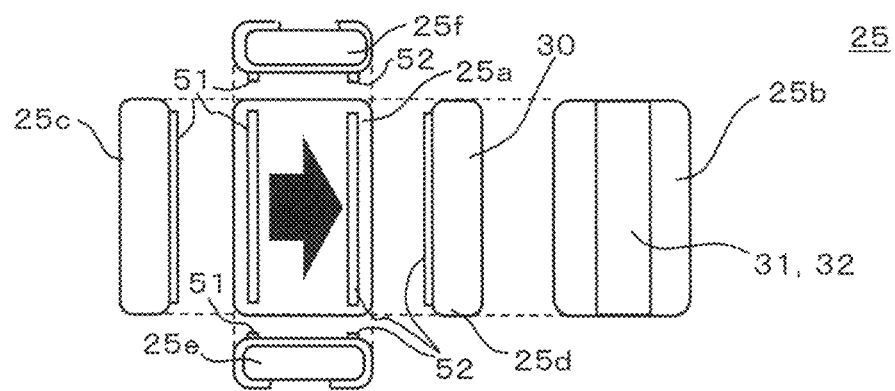
Figure 7:
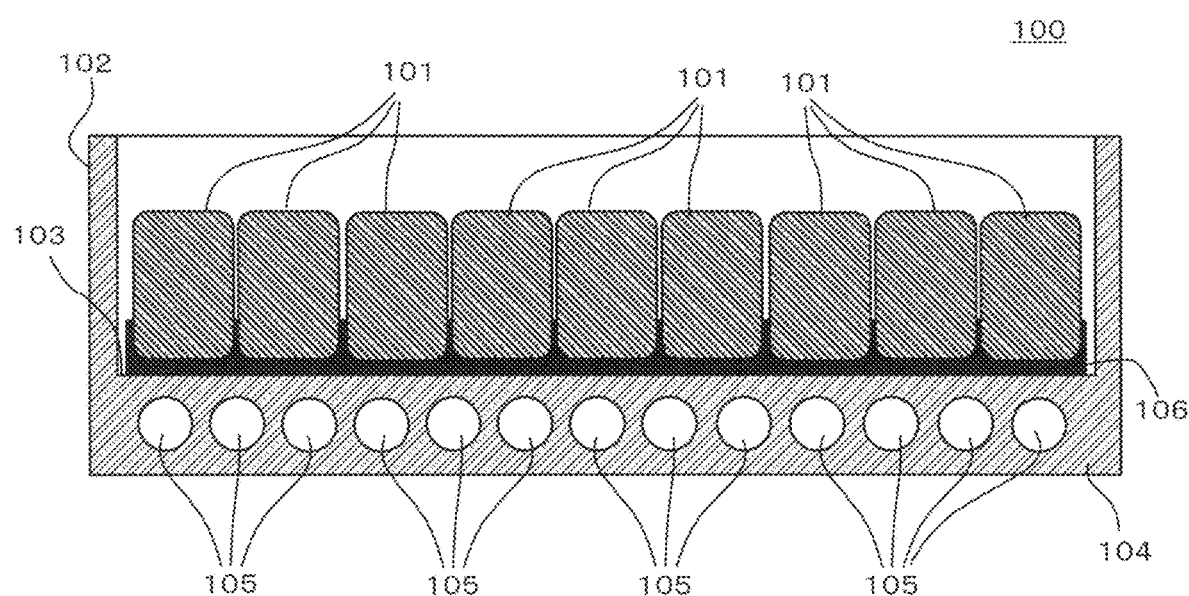
FIG. 7 shows a schematic sectional view of a conventional battery.

FIG. 6A to FIG. 6C show six views of various modifications of the heat dissipating structure according to the present invention.

The following various modifications can be included to at least one of the batteries 1, 1a, 1b.

(1) First Modification

A heat dissipating structure 25 of FIG. 6A is a first modification in which an energization heating mechanism is added to the heat dissipating structure 25 of FIG. 3A. The heat dissipating structure 25 of the first modification includes electrodes for energization (also simply referred to as "electrodes" or "electrode") 51, 52 capable of supplying electricity to heat the thermally conductive sheet 30 or the cushion member 31. The electrodes 51, 52 are placed at a distance from one another on the top surface 25a so that the current flows in a direction from the electrode 51 to the electrode 52 (direction of a black thick arrow). In this modification, the electrodes 51, 52 are embedded inside a rubber sheet 50. Alternatively, the electrodes 51, 52 may be sandwiched between the thermally conductive sheet 30 and the rubber sheet 50. The rubber sheet 50 has a function of tightly fixing the thermally conductive sheet 30 to the periphery of the battery cells 20. The rubber sheet 50 is electrically conductive and formed of a resistive heating material. For this reason, the rubber sheet 50 functions as a sheet letting the current flow from the electrode 51 to the electrode 52, thereby generating heat resulting from its electrical resistance. The rubber sheet 50 is required to have excellent electrical conductivity compared to the thermally conductive sheet 30. This is to let the current flow preferentially to the rubber sheet 50 with respect to the thermally conductive sheet 30 when a voltage is applied between the electrodes 51, 52.

The rubber sheet 50 can be formed of various kinds of elastic bodies like the above-described cushion member 31 but is preferably made mainly of a rubber that can be heated by energization and has excellent thermal conduction property, as it is necessary to rapidly transfer the heat from the battery cells 20 to the thermally conductive sheet 30. Preferably, when the rubber sheet 50 is made mainly of silicone rubber, a filler such as graphite or aluminum is dispersed in the silicone rubber. More preferably, in addition to this, a filler such as AlN or alumina is dispersed in the silicone rubber. The rubber sheet 50 made of silicone rubber may be exemplified by a silicone rubber combining bifunctional silicone raw rubber with silicone resin to increase its stickiness. The silicone resin is preferably exemplified by MQ resin. The MQ resin is formed by crosslinking each Q unit with four-dimensional branching in which an oxygen atom is bonded to each four bonds of a Si atom and then, to stop the reactivity of the end group, bonding thereto M units with one-dimensional branching in which an oxygen atom is bonded to a bond of each Si atom. The silicone resin containing lots of hydroxyl groups is preferably used to enhance its stickiness.

The rubber sheet 50 preferably has a function of enhancing adhesiveness between the battery cells 20 and the thermally conductive sheet 30. As long as the rubber sheet 50 has electrical conductivity, heat resistant property, and stickiness, its hardness is not limited, but in the case of a sheet made mainly of silicone rubber, the sheet has a Shore OO hardness of 60, preferably 40 or less, and more preferably 10 or less. This is because the lower the hardness of the rubber sheet 50, the easier it is to absorb unevenness on surfaces of the battery cells 20. Further, the rubber sheet 50 preferably has a thickness of 0.3-5 mm, more preferably 0.7-3 mm, and even more preferably 1-2.5 mm. Note that, the thickness of the rubber sheet 50 is preferably determined in accordance with conditions such as thicknesses of the electrodes 51, 52, the unevenness of the battery cells 20, and the hardness of the rubber.

(2) Second Modification

A heat dissipating structure 25 of FIG. 6B is a second modification differentiated from the first modification in the mounting position and shape of the electrodes 51, 52, and does not include the rubber sheet 50. That is, the thermally conductive sheet 30 generates heat using its electrical conductivity (it may be referred also as electrical resistance) by the electrical supply from the electrode 51 to the electrode 52. The electrodes 51, 52 are placed at a distance from one another on left and right side surfaces 25c, 25d so that the current flows in a direction from the electrode 51 to the electrode 52 (direction of thick black arrows). In this case, the thermally conductive sheet 30 has higher electrical conductivity than the housing 11 because it is not preferable that the current flow to the housing 11. However, the housing 11 may have higher electrical conductivity than the thermally conductive sheet 30, provided that the insulation property between the housing 11 and the thermally conductive sheet 30 is ensured. The thermally conductive sheet 30 preferably contains carbon filler and resin. The carbon filler preferably has electrical conductivity, and is, for example, graphite filler. The thermally conductive sheet 30 may be formed of a material excellent in both electrical conductivity and heat conduction property.

(3) Third Modification

A heat dissipating structure 25 of FIG. 6C is a third modification differentiated from the second modification in mounting positions of the electrodes 51, 52. The electrodes 51, 52 are placed at a distance from one another on a top surface 25a by rotating the respective electrodes of the first modification by 90 degrees so that the current flows in a direction from the electrode 51 to the electrode 52 (direction of a thick black arrow). The thermally conductive sheet 30 generates heat utilizing own electrical conductivity by the supply of electricity to the electrode 52 from the electrode 51, which is in common with the second modification.

(4) Others

A rubber sheet having a low hardness similar to the rubber sheet 50 may be interposed between the thermally conductive sheet 30 and the bottom 12. In this case, the rubber sheet has a function of tightly fixing the thermally conductive sheet 30 to a periphery of the cooling member 15 (the bottom 12, i.e.). It is sufficient if the rubber sheet has a function of facilitating the transfer of heat received from the battery cells 20 through the thermally conductive sheet 30 to the bottom 12, and high electric conductivity is not required for the rubber sheet. The rubber sheet is not an essential component to the heat dissipating structure 25 and the batteries 1, 1a, 1b.

Other Embodiments

Preferred embodiments of the present invention have been described as above, but the present invention is not limited to these embodiments, and various modifications can be made.

For example, the heat source includes not only the battery cells 20, 20a but also all objects generating heat such as circuit boards and electronic device bodies. For example, the heat source may be an electronic component such as a capacitor or an IC chip. Likewise, the cooling member 15 may be not only water for cooling but also organic solvent, liquid nitrogen, or gas for cooling. Further, the heat dissipating structures 25, 45 may be included not only to the batteries 1, 1a, 1b, but also in, for example, electronic devices, household electric appliances, and power generation devices.

A part of each heat dissipating structure 25, 45 (the thermally conductive sheet 30 alone or the thermally conductive sheet 30 and the cushion member 31) may be inserted into a gap between the battery cells 20.

Additionally, any components of each of the embodiments may be freely combined except when it is impossible to combine the components with each other. For example, in the third embodiment, one battery cell 20a as in the second embodiment may be supported by a plurality of the heat dissipating structures 45. Each of the various modifications of the heat dissipating structure 25 shown in FIG. 6A to 6C can be used instead of the heat dissipating structures 25, 45 of the second embodiment and the third embodiment.

INDUSTRIAL APPLICABILITY

The heat dissipating structures according to the present invention can also be used for various electronic devices such as vehicles, industrial robots, power generation devices, PCs, and household electric appliances, in addition to vehicle batteries, for example. The batteries according to the present invention can also be used as home-use chargeable and dischargeable batteries and batteries for electronic devices such as PCs, in addition to the vehicle batteries.

The invention claimed is:

1. A battery, comprising:
a plurality of battery cells, as a heat source, in a housing to come into contact with a cooling member; and
a heat dissipating structure provided between the heat source and the cooling member, and enabling heat dissipation from the heat source by conducting heat from the heat source to the cooling member, the heat dissipating structure comprising:
a thermally conductive sheet comprising at least one of metal, carbon, and ceramic and settable between the plurality of battery cells and the cooling member; and
a cushion member at least partially covered with the thermally conductive sheet,
wherein
the thermally conductive sheet has an O-shaped cross section or a downward-C-shaped cross section with an opening facing the cooling member in a part disposed between the heat source and the cooling member, and
the cushion member is arranged inside the thermally conductive sheet.

2. The battery of claim 1, wherein
in the cushion member, at least one end of both ends in a longitudinal direction of the heat dissipating structure is exposed from the thermally conductive sheet.

3. The battery of claim 1, wherein
the heat dissipating structure further comprises a rubber sheet tightly fixing the thermally conductive sheet to at least one of the heat source and a periphery of the cooling member.

4. The battery of claim 3, wherein
the rubber sheet is made of silicone rubber.

5. The battery of claim 1, wherein
the thermally conductive sheet comprises carbon filler and resin.

6. The battery of claim 1, wherein
the heat dissipating structure further comprises energization electrodes capable of supplying electricity to heat the thermally conductive sheet or the cushion member.

7. The battery of claim 1, wherein a plurality of the heat dissipating structures is provided in the housing, each heat dissipating structure mounting one or more of the battery cells in the housing.

8. The battery of claim 7, wherein the plurality of heat dissipating structures is arranged at a distance from one another not to come into contact with each other even when compressed by the battery cells mounted on the heat dissipating structures.

* * * * *